(12) United States Patent
Ufert

(10) Patent No.: US 7,410,868 B2
(45) Date of Patent: Aug. 12, 2008

(54) METHOD FOR FABRICATING A NONVOLATILE MEMORY ELEMENT AND A NONVOLATILE MEMORY ELEMENT

(75) Inventor: Klaus-Dieter Ufert, Unterschleissheim (DE)

(73) Assignee: Infineon Technologies AG, Munich (DE)

( * ) Notice: Subject to any disclaimer, the term of this patent is extended or adjusted under 35 U.S.C. 154(b) by 189 days.

(21) Appl. No.: 11/398,852

(22) Filed: Apr. 6, 2006

(65) Prior Publication Data

US 2006/0234418 A1    Oct. 19, 2006

(30) Foreign Application Priority Data

Apr. 19, 2005   (DE) .................. 10 2005 018 096

(51) Int. Cl.
*H01L 21/336* (2006.01)

(52) U.S. Cl. .................. 438/257; 438/99; 438/253; 438/270; 257/E21.209

(58) Field of Classification Search ............. None
See application file for complete search history.

(56) References Cited

U.S. PATENT DOCUMENTS

2004/0256662 A1* 12/2004 Black et al. .............. 257/317

OTHER PUBLICATIONS

Husband et al., "Logic and Memory with Nanocell Circuits," *IEEE Transactions on Electron Devices*, vol. 50, No. 9, pp. 1865-1875, Sep. 2003.
Kanwal et al., "Organic Memory Devices Using $C_{60}$ and Insulating Polymer," *Mater. Res. Soc. Symp. Proc.*, vol. 830, pp. D7.2.1-D7.2.5, 2005.
German Office Action dated Feb. 6, 2006.

* cited by examiner

*Primary Examiner*—Michael S. Lebentritt
*Assistant Examiner*—Kyoung Lee
(74) *Attorney, Agent, or Firm*—Patterson & Sheridan, L.L.P.

(57) ABSTRACT

In a method for fabricating a nonvolatile memory element a substrate is provided, a nanomask structure is fabricated on the substrate and a self-assembled monolayer of an organic memory molecule is grown on the substrate on a region not covered by the nanomask structure. A surface of the substrate is patterned by means of an electrode beam in order to form regions with organic memory molecules and regions without organic memory molecules and a top contact is applied to the monolayer formed from the organic memory molecules and the nanomask.

9 Claims, 5 Drawing Sheets

2.9 nm 7.9 nm

METHOD FOR FABRICATING A NONVOLATILE MEMORY ELEMENT AND A NONVOLATILE MEMORY ELEMENT

BACKGROUND OF THE INVENTION

1. Field of the Invention

The present invention relates to a method for fabricating a nonvolatile memory element and a nonvolatile memory element.

2. Description of the Related Art

The memory concepts (floating gate memories such as flash and DRAM) used to date are based on the storage of charges in inorganic, silicon-based materials. The technology for the storage of charges will encounter scaling limits in the foreseeable future. Therefore, alternative methods for storing information are increasingly being sought. In this case, the principle of resistive switching between two stable resistance states in organic molecules has proved to be promising.

Conjugated oligophenyleneethynylenes are used in this case as molecular wires in components (with nonlinear 1(V) curves for dynamic random access memories (DRAM)). Such organic molecules, such as e.g. amino-4-ethynylphenyl-benzenethiol, are grown in a self-assembled monolayer (SAM). The open end of the molecular wires is subsequently provided with a top contact.

One problem in the deposition of self-assembled molecular monolayers is the adhesion or chemical binding of the organic molecule on the substrate. The semiconductor material (M. C. Hersam, R. G. Reifenberger; MRS Bulletin Vol. 29, No. 6 (2004) p. 385). A further problem is the compatibility of the process for fabricating the organic molecular memory element with the existing CMOS technology. No solution has hitherto been found either for the technological transfer of the molecular dimensions of the individual organic memory cells to a contact-connectable array comprising memory cells with the utilization of standard technologies, the intention being to retain as far as possible the advantage of the small dimensioning of the organic memory cell.

It has not been possible hitherto to satisfactorily realize either the coupling of the organic memory molecule to the substrate or integration of the organic memory molecule into a configuration that is compatible in conventional silicon technology in the dimension range of a few nanometers.

FIG. 1 shows a conventional realization of a molecular monolayer grown on gold with a gold contact (C. Zhou, M. R. Deshpande, M. A. Reed, L. Jones II and J. M. Tour; Appl. Phys. Left. 71(5), p. 611). In a membrane 1 made of SiN, a pore is opened by means of a plasma etching method (see FIG. 1a). Gold 3 is vapor-deposited into the well-type opening with a diameter of approximately 30 nm, whereupon organic memory molecules 4 are applied in the form of a SAM. The layer 4 made of organic molecules grown on the gold contact 3 is contact-connected by a further contact 2 made of titanium and gold (see FIG. 1b, an enlarged view from FIG. 1a). The enormous difference in the dimensions is clearly visible here. Dense packing of resistive memory cells has not been possible hitherto using this technology.

FIG. 2 shows an enlarged view of the resistive memory element. Gold contacts 6 are applied on a substrate 5. The contact between the molecule and the gold layer 6 is effected via a sulfide bridge of a thiol group of the organic molecule. As in this example, the top contact 7 may also be effected via a palladium contact or a metal-coated nanotube.

It has hitherto been possible to resolve the binding of organic memory molecules, such as e.g. amino-4-ethynylphenylbenzenethiol, via the thiol group to the substrate, which must be coated with a gold layer (J. Chen, M. A. Reed, A. M. Rawlett, J. M. Tour; Science, Vol. 2286 (1999), p. 1550Q). Complicated process steps have been required in this case, such as e.g. etching a bowl-shaped depression into the wafer, etching pores into a silicon membrane, filling in the gold bottom contact, and also mechanical polishing of the gold contact, as illustrated in FIG. 1. The integration of gold layers and the chemical mechanical polishing of this material are not possible without problems in the existing CMOS technology. In addition to the higher costs that occur as a result, the advantage of the small molecular dimensions and the high packing density possible can only be utilized to an unsatisfactory extent in the memory cell configuration realized to date. The high outlay and the low reproducibility in the application of titanium- or palladium-coated carbon nanotubes as top contacts on the organic memory molecules also constitute a problem.

SUMMARY OF THE INVENTION

The invention provides a method for fabricating a nonvolatile memory element comprising the steps of
 a) providing a substrate;
 b) fabricating a nanomask structure on the substrate;
 c) growing a self-assembled monolayer of an organic memory molecule on the substrate on the region not covered by the nanomask structure;
 d) patterning the substrate surface by means of an electrode beam in order to form regions with organic memory molecules and regions without organic memory molecules;
 e) applying a top contact to the monolayer formed from organic memory molecules and the nanomask.

The invention also provides a nonvolatile memory element comprising a substrate, on which a nanomask structure is applied, and which has regions with organic memory molecules and regions without organic memory molecules and also a top contact.

The idea on which the present invention is based consists in restricting the contact area with a nanomask to effective contact areas, for example in the range of 2.5 nm to 15 nm, preferably 3 nm to 7 nm, in enabling the organic molecules to be bonded directly onto a silicon or silicon oxide substrate via nitrile groups, and in patterning the memory elements by means of electron beam lithography.

For the direct binding of the organic memory molecule, the latter is provided with a nitrile group as anchor group instead of with a thiol group. A direct binding to a substrate made of silicon or silicon oxide can be effected via the nitrogen of the nitrile group. The application of a gold layer on which the organic memory molecules grow in the form of self-assembled monolayers becomes superfluous as a result of this.

Small structures are provided by the application of a nanoparticle mask on the substrate. The nanomask provides effective contact areas in the range from 3 nm to 7 nm. The nanoparticle mask may be made e.g. of $SiO_x$ nanoparticles and applied directly on a silicon wafer.

The organic memory molecules grown on the remaining free area, the effective contact area, can be patterned by means of electron beam lithography without using structure masks in strips having a width of e.g. 20 nm. The strip-type regions with organic molecules grown thereon may have a width of 15 nm to 50 nm. By means of the electrode beam, which can be focused very finely and thus permits precise patterning, the organic memory molecules are removed in the region struck by the beam, e.g. by vaporization or melting and chemical conversion. The underlying layer may be converted e.g. from silicon into silicon oxide. Consequently, it is possible to fabricate a nonvolatile, molecular organic memory element which requires a considerably smaller memory space, manages with a lower power demand and can be implemented with a lower outlay.

In order to complete the memory cell with organic molecules, a top contact is applied to the molecules and the nanomask in a very gentle fashion, This may be effected e.g. by vapor deposition of a gold layer in vacuo with a cooled substrate. Titanium- or palladium-coated carbon nanotubes (C-nanotubes) may also be used as the top contact.

Consequently, the present invention solves the problem mentioned in the introduction by virtue of the fact that a nanomask structure is fabricated on a provided substrate, a self-assembled monolayer of an organic memory molecule is grown on the substrate, the substrate surface is patterned by means of an electrode beam and a top contact is subsequently applied to the layer made of organic memory molecules and the nanomask.

The substrate provided may be a silicon wafer, the nanoparticles may comprise $SiO_x$ or ZnO nanoparticles or insulating metal oxide nanoparticles, the organic memory molecules may be bound to the silicon substrate via a nitrile group or the top contact may be applied by vapor deposition of a gold layer. In this case, it is particularly preferred if the substrate is cooled during the vapor deposition and/or if the vapor deposition is carried out in vacuo.

The top contact may be a carbon nanotube coated with titanium or palladium.

The silicon substrate may be rinsed and dried after the growth of the self-assembled monolayer made of organic memory molecules. The drying may be effected by means of a stream of dried inert gas. The drying is preferably effected in a dry nitrogen gas stream.

The present invention also covers a memory element fabricated by the method. Said memory element is preferably arranged in a cross point array.

DESCRIPTION OF THE PREFERRED EMBODIMENTS

In the figures, identical reference symbols designate identical or functionally identical components.

Figure 1A:
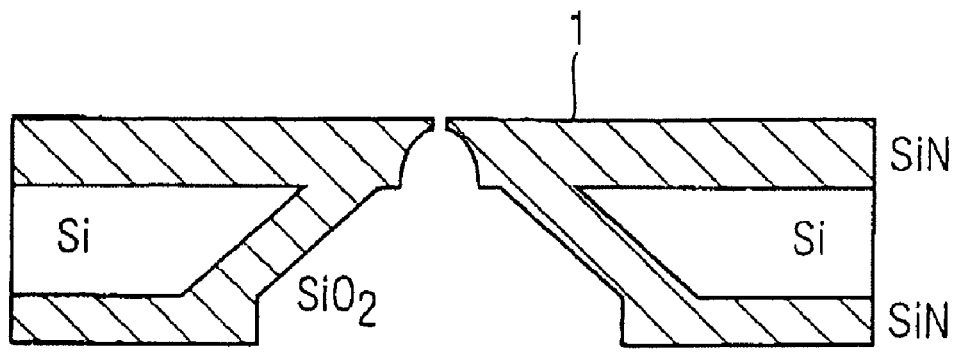
FIG. 1, as discussed above, is an arrangement of a nonvolatile memory element fabricated according to a conventional method.
Figure 1B:
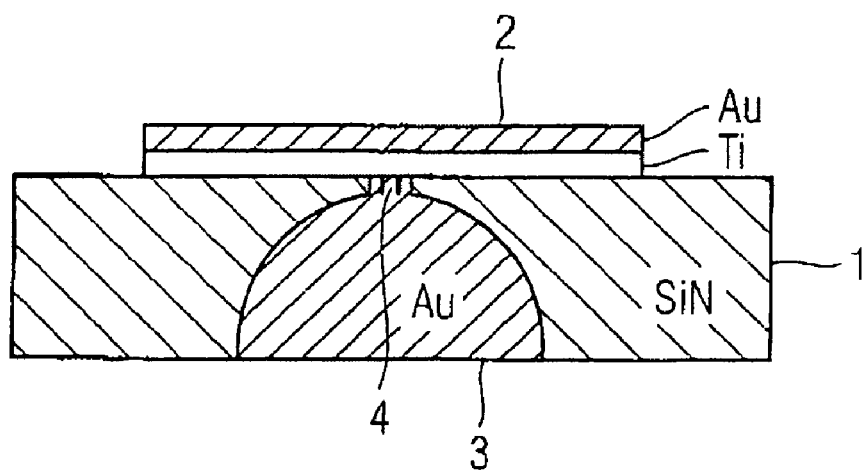

FIG. 1 shows a nonvolatile memory element with organic molecules according to the prior art. Complicated process steps have hitherto been necessary for fabricating such a memory molecule. These include etching a bowl-shaped depression into the wafer, etching pores into a membrane 1 made of SiN, filling in the gold bottom contact 3 and also the mechanical polishing of the gold contact. FIG. 1 furthermore shows the organic molecules 4 applied on the gold contact and also an applied top contact 2 made of titanium and gold.

Figure 2:
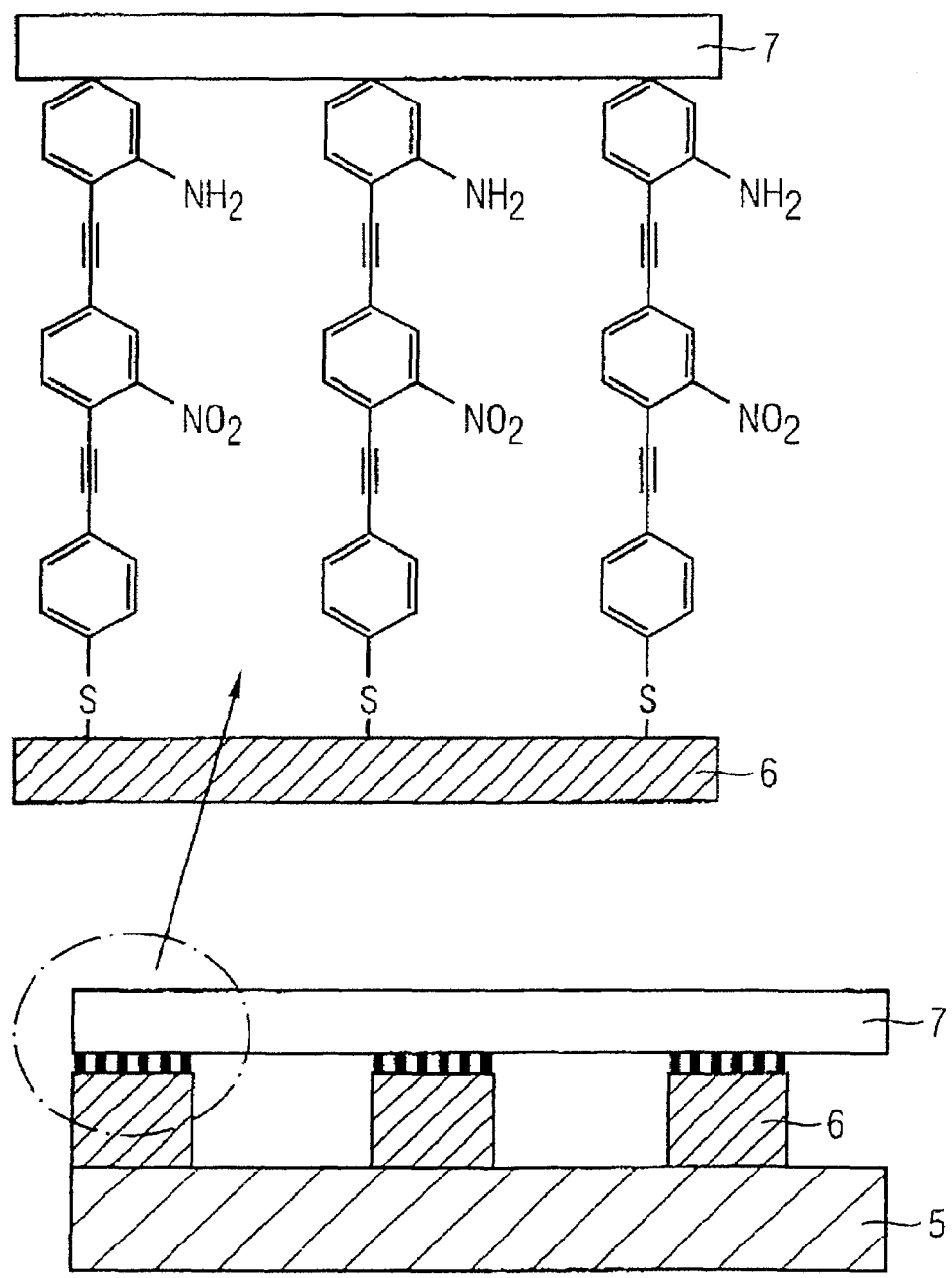
FIG. 2, as discussed above, is the binding of organic memory molecules to a gold surface and the contact-connection by means of a palladium top contact according to the prior art.

FIG. 2 shows a detail from such a memory element of conventional design. In this case, organic molecules are anchored on a gold layer 6 via a sulfur bridge. The top contact 7 is produced by a palladium-coated carbon nanotube.

Figure 3:
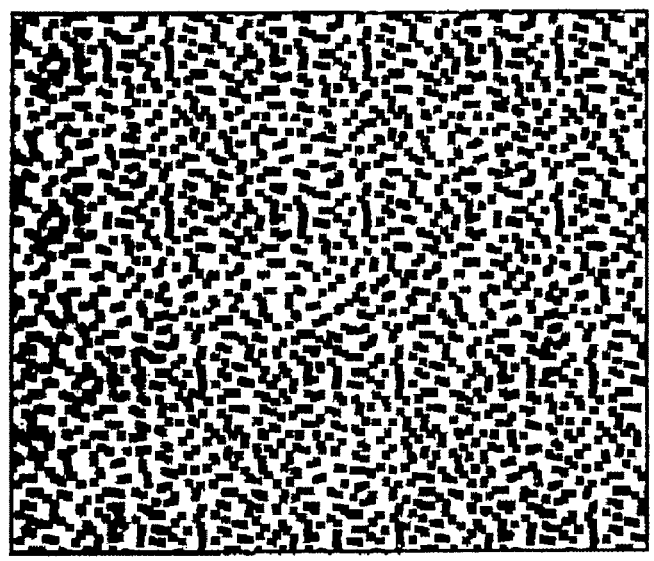
FIG. 3 is a nanostructure with 2.9 nm openings fabricated according to an exemplary embodiment.
Figure 4:
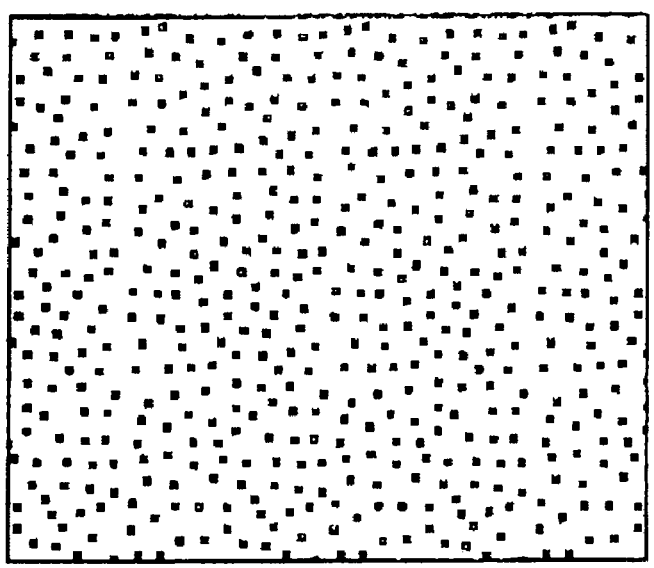
FIG. 4 is a nanostructure with 7.9 nm openings fabricated according to another exemplary embodiment.

FIGS. 3 and 4 show a nanomask structure with 2.9 nm openings and 7.9 nm openings, respectively, fabricated according to the exemplary embodiment.

Figure 5:
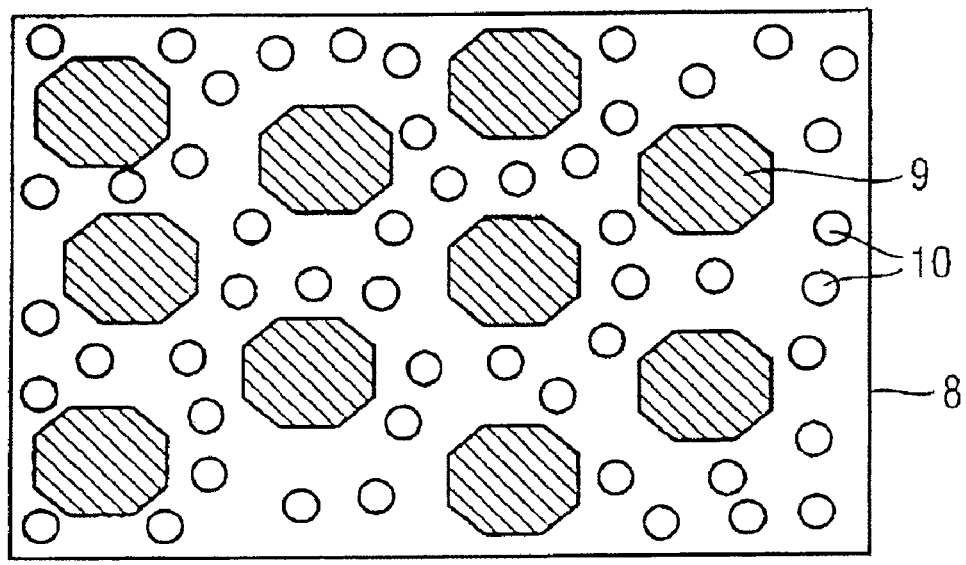
FIG. 5 is a schematic illustration of the surface structure of the memory cell after formation of the nanomask, application of the organic molecules and prior to the patterning.

FIG. 5 shows the schematic illustration of the surface structure prior to the patterning with an electron beam. In this case, nanoparticles 9 have been applied on a substrate 8. Organic memory molecules 10 in the form of an SAM have been applied in the free spaces between the nanoparticles.

Figure 6:
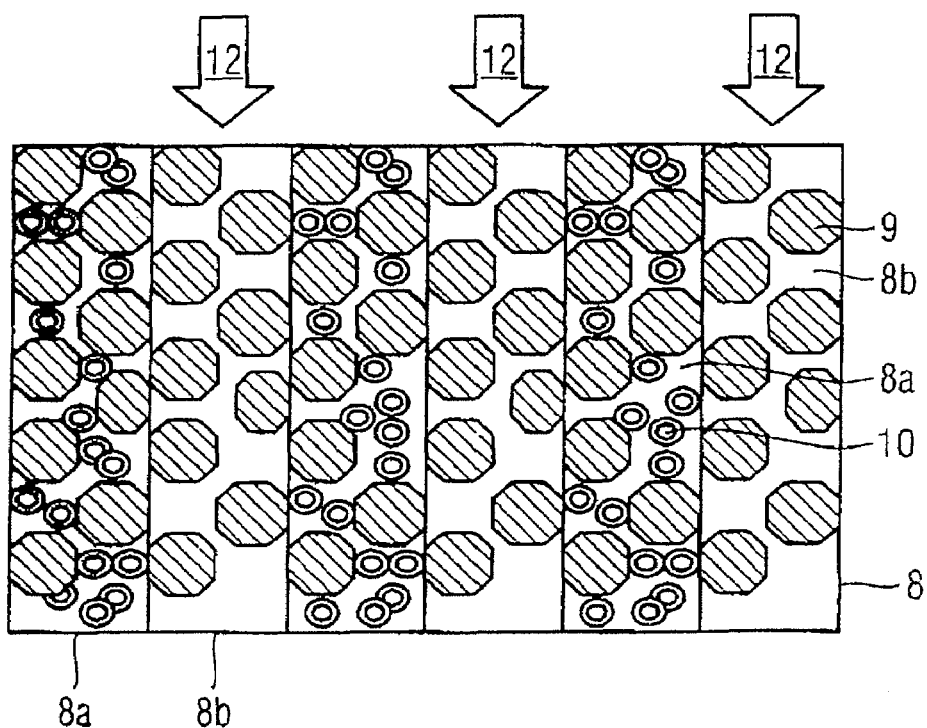
FIG. 6 is a schematic illustration of the surface structure according to the invention of the memory cell after the reactive electron beam patterning and prior to the deposition of the top contact.

FIG. 6 shows the schematic illustration of the surface structure according to the invention of the memory cell after the reactive electron beam patterning with an electron beam 12 and prior to the top contact deposition. The nanomask particles 9 are applied on a substrate made of silicon 8. The application of an oxidic nanostructure is described thoroughly using the example of ZnO e.g. in R. F. Mulligan, A. Iliadis, P. Kofinas: J. Appl. Polymer Science, Vol. 89 (2003) p. 1058 and R. T. Clay, R. E. Cohen; Supramol. Science Vol. 5 (1998) p. 41. Metal oxide nanoparticles can likewise be fabricated from other metals. Although nanoparticles made of ZnO can produce a suitable mask structure, nanoparticles made of $SiO_x$ are preferably used on silicon substrates. After the provision of the nanomask organic molecules 10 are grown on the surface. This is effected by means of SAM. During patterning, the area 8b freed of organic molecules can be oxidized to form silicon oxide.

Starting substances for the synthesis of an oxidic nanostructure are the block copolymers comprising polynorbornene and poly(norbornene dicarboxylic acid). These copolymers form the original for the nanoparticle structure. After the synthesis of the copolymer the latter is dissolved again after drying. The amount of e.g. $SiCl_4$ or $ZnCl_2$ dissolved in e.g. tetrahydrofuran is then introduced into this solution. The cations such as e.g. $Si^{4+}$ or $Zn^{2+}$ bond in the solution with the carboxyl groups of one block copolymer.

Once this solution is applied to the substrate, e.g. a silicon bottom electrode substrate, a layer grows in a hexagonally ordered manner in a self-assembled process. The solution can be applied by means of spinning-on, or the substrate is dipped into the solution. The corresponding salt made of e.g. $Si^{4+}$ or $Zn^{2+}$ and carboxylate can be converted into a metal or silicon oxide by means of ammonium hydroxide. The copolymer is subsequently removed by plasma ashing. The copolymer can also be removed by other plasma methods or chemical dissolution. A nanomask structure made of nanoparticles arises on the substrate as a result. The nanoparticle size and the nanomask opening can be varied in the range of between 2.5 nm and 15 nm.

The organic molecules are grown by the method of deposition of self-assembled monolayers (SAM). In this case, the organic molecules have a nitrile group via which the molecule can be bound to the substrate surface made of silicon. By way of example, 2'-amino4-ethynylphenyl-4'-ethynyl phenyl-5'-nitro-1-benzonitrile may be used as the organic molecule. For application of the self-assembled monolayer, the substrate is dipped into a solution of the molecules. After deposition, the substrate may be rinsed and may preferably be dried in a dry nitrogen stream.

The substrate provided with the nanoparticle mask and the organic memory molecules is subsequently patterned by means of an electron beam. This patterning may be carried out in an oxygen-rich atmosphere, whereby the silicon substrate is readily oxidized at the surface. In this case, the $SiO_x$ nanoparticles are not altered or are merely oxidized further by the low-energy electron beam.

Figure 7:
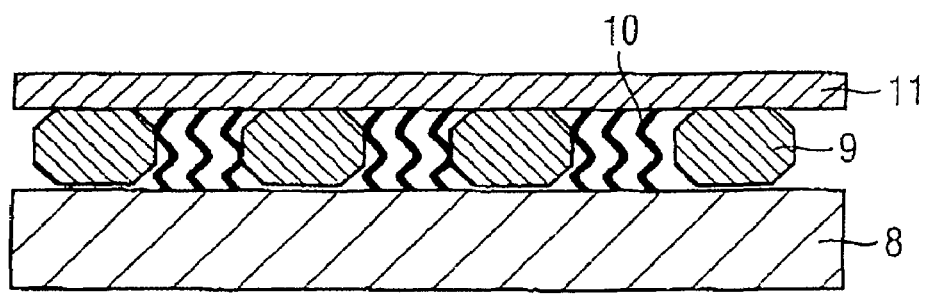
FIG. 7 is a schematic illustration of the active molecular memory cell in a side view.

FIG. 7 shows the schematic illustration of the active molecular memory cell in a side view. A gold contact 11 has been applied to the nanoparticle mask 9. Said gold contact is applied in a very gentle fashion e.g. by vapor deposition in vacuo and/or with a cooled substrate. It is also possible to use titanium- or palladium-coated carbon nanotubes as the top contact. In this case, the top contact is carried by the nanoparticles 9 of the nanoparticle mask and touches the organic memory molecules.

By contact-connecting the two contacts 8 and 11, a current can flow via the molecular wires made of organic memory material. By applying voltages higher than the threshold voltage, the organic molecule can be changed over between two resistive states.

EXAMPLE

A silicon electrode structure is fabricated on the basis of SOI technology. For this purpose, an oxidized silicon wafer is pressed together with an elemental silicon wafer at high pressure and high temperature and the silicon wafer side is subsequently thinned by means of chemical mechanical polishing (CMP). The silicon tracks are etched by means of currently used silicon etching techniques, such as, e.g. dry etching by means of reactive plasma etching on the basis of HBr and $O_2$ or $SF_5$. A copolymer comprising polynorbornene and poly(norbornene dicarboxylic acid) is subsequently prepared. After the copolymer has been dried it is dissolved again and the stoichiometric amount of $SiCl_4$ dissolved in THF is then added. This solution is applied to the silicon substrate. In this case, the layer grows in a hexagonally ordered manner in a self-assembled process. The silicon salt is converted into silicon oxide by ammonium hydroxide. The copolymer is subsequently removed by plasma ashing. A nanomask structure made of nanoparticles (see FIGS. 3 and 4) remains on the wafer. The substrate prepared in this way has applied to it 2'-amino4-ethynylphenyl-4'-ethynylphenyl-5'-nitro-1-benzonitrile dissolved in a solvent. The substrate is rinsed with the solvent and dried in a dry nitrogen stream. The silicon wafer provided with the organic memory molecule and the nanoparticle mask is patterned by means of an electron beam in an oxygen-rich atmosphere. The organic molecular monolayer is removed in defined tracks by means of the finally focused electron beam. In this case, the $SiO_x$ nanoparticles are not altered or are at most oxidized further. The silicon surface is slightly oxidized by the heating in an oxygen-rich atmosphere.

In order to complete the organic molecular memory cell, a gold layer is applied to the nanoparticles and the organic molecules in a very gentle fashion by vapor deposition in vacuo with a cooled substrate.

Although the present invention has been described above on the basis of preferred exemplary embodiments, it is not restricted thereto, but rather can be modified in diverse ways.

I claim as my invention:

1. A method for fabricating a nonvolatile memory element, comprising the steps of:
   providing a substrate;
   fabricating a nanomask structure on said substrate;
   growing a self-assembled monolayer of an organic memory molecule on said substrate on a region not covered by said nanomask structure;
   patterning a surface of said substrate by means of an electrode beam in order to form regions with organic memory molecules and regions without organic memory molecules; and
   applying a top contact to said monolayer formed from said organic memory molecules and said nanomask.

2. The method of claim 1, wherein said substrate is a silicon substrate.

3. The method of claim 1, wherein said nanoparticles are at least one of a group consisting of $SiO_x$, ZnO, and insulating metal oxide nanoparticles.

4. The method of claim 1, comprising binding said organic memory molecules to said substrate via a nitrile group.

5. The method of claim 1, comprising applying said top contact by vapor deposition of a gold layer.

6. The method of claim 5, comprising cooling said substrate during said vapor deposition.

7. The method of claim 5, comprising carrying out said vapor deposition in vacuo.

8. The method of claim 1, wherein said top contact is a carbon nanotube coated with titanium or palladium.

9. The method of claim 1, comprising drying said substrate after growing said self-assembled monolayer on said substrate.

* * * * *